(12) United States Patent
Suzuki (10) Patent No.: US 6,842,386 B2
(45) Date of Patent: Jan. 11, 2005

(54) SEMICONDUCTOR INTEGRATED CIRCUIT, AND A DATA STORING METHOD THEREOF

(75) Inventor: Hideaki Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/101,843

(22) Filed: Mar. 21, 2002

(65) Prior Publication Data

US 2003/0076714 A1 Apr. 24, 2003

(30) Foreign Application Priority Data

Oct. 18, 2001 (JP) ........................................ 2001-320910

(51) Int. Cl.$^7$ ........................... G11C 29/00; G11C 7/00
(52) U.S. Cl. ........................... 365/200; 326/8; 711/165; 713/200
(58) Field of Search ...................... 365/185.04, 189.09, 365/195, 200, 230.06; 711/165; 326/8; 713/200

(56) References Cited

U.S. PATENT DOCUMENTS

| | | | |
|---|---|---|---|
| 5,452,355 A | * | 9/1995 | Coli ............................. 713/194 |
| 6,076,149 A | * | 6/2000 | Usami et al. ................ 711/163 |
| 6,246,616 B1 | | 6/2001 | Nagai et al. |
| 2001/0055227 A1 | * | 12/2001 | Takata et al. ................ 365/199 |

* cited by examiner

*Primary Examiner*—Van Thu Nguyen
(74) *Attorney, Agent, or Firm*—Arent Fox (57) ABSTRACT

A semiconductor integrated circuit includes a main memory unit, a redundancy memory unit and a redundancy information file unit, wherein at least a part of data that would otherwise be stored in the main memory is stored in the redundancy memory unit according to redundancy information stored in the redundancy information file unit, thereby secrecy of the data stored in this manner is enhanced.

11 Claims, 7 Drawing Sheets

SEMICONDUCTOR INTEGRATED CIRCUIT, AND A DATA STORING METHOD THEREOF

BACKGROUND OF THE INVENTION

1. Field of the Invention

The present invention generally relates to a semiconductor integrated circuit and a data storing method thereof, and specifically relates to technology that enhances secrecy of data stored in a memory device, and enhances reliability of memory operations.

2. Description of the Related Art

In recent years, information technology has progressed rapidly. Versatile information is stored as electronic data and can be accessed. With such a background, a risk is that the data written in the memory device are acquired and analyzed by an unauthorized party, and once the data are acquired, great damages are likely to be caused.

Quantity of the semiconductor memory devices used has been growing rapidly, and applications have been highly diversified. It is becoming impossible to simply replace memory device (module etc.) if a memory device is damaged during use. It is desirable that a self-repair function is provided to the memory device, such that unavailability of a system can be minimized by the self-repair function.

In a conventional manner of data writing to a semiconductor memory device, data with a low degree of secrecy are written as they are, while data with a high degree of secrecy are first encrypted by application software, and then written.

When strong code intensity, i.e., a firm protection is desired, software encryption requires a great amount of calculations, causing a response speed to be slow. Thus, protection strength has been restricted. Further, if encrypted data were read indirectly by a data pattern analyzing technique, modified, and rewritten to the memory, the encryption does not serve the purpose of storing the data intact.

SUMMARY OF THE INVENTION

Accordingly, it is a general object of the present invention to provide a semiconductor integrated circuit, and a data storing method thereof that substantially obviate one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the semiconductor integrated circuit, and the data storing method particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor integrated circuit, and a data storing method, whereby uniform and flexible encryption processing is provided, independent of the degree of confidentiality of data to be written in the memory device.

The semiconductor integrated circuit of the present invention includes a main memory unit, a redundancy memory unit, and a redundancy information file unit. At least a part of data that are otherwise to be stored in the main memory is stored in the redundancy memory unit, according to redundancy information stored in the redundancy information file unit. Consequently, physical location of the part of the data is changed, enhancing secrecy of the data stored. In this manner, the semiconductor integrated circuit provides uniform and flexible encryption processing that is independent of the degree of confidentiality of the data to be written in the memory.

Further, the semiconductor integrated circuit of the present invention, including the main memory unit, the redundancy memory unit, and the redundancy information file unit, stores data in the redundancy memory unit. The data is replaces at least a part of the data stored in the main memory, according to redundancy information stored in the redundancy information file unit. In this manner, a bank-like switching operation between the main memory unit and the redundancy memory unit is realized, in addition to the uniform and flexible encryption described above.

The semiconductor integrated circuit of the present invention, including the main memory unit, the redundancy memory unit, and the redundancy information file unit, uses the redundancy memory unit such that a defective cell in the main memory unit is saved, in addition to storing at least a part of the data to be stored. In this manner, both saving of a defective cell and an improvement in data security are simultaneously realized.

DESCRIPTION OF THE PREFERRED EMBODIMENTS

In the following, embodiments of the present invention will be described with reference to the accompanying drawings.

Figure 1:
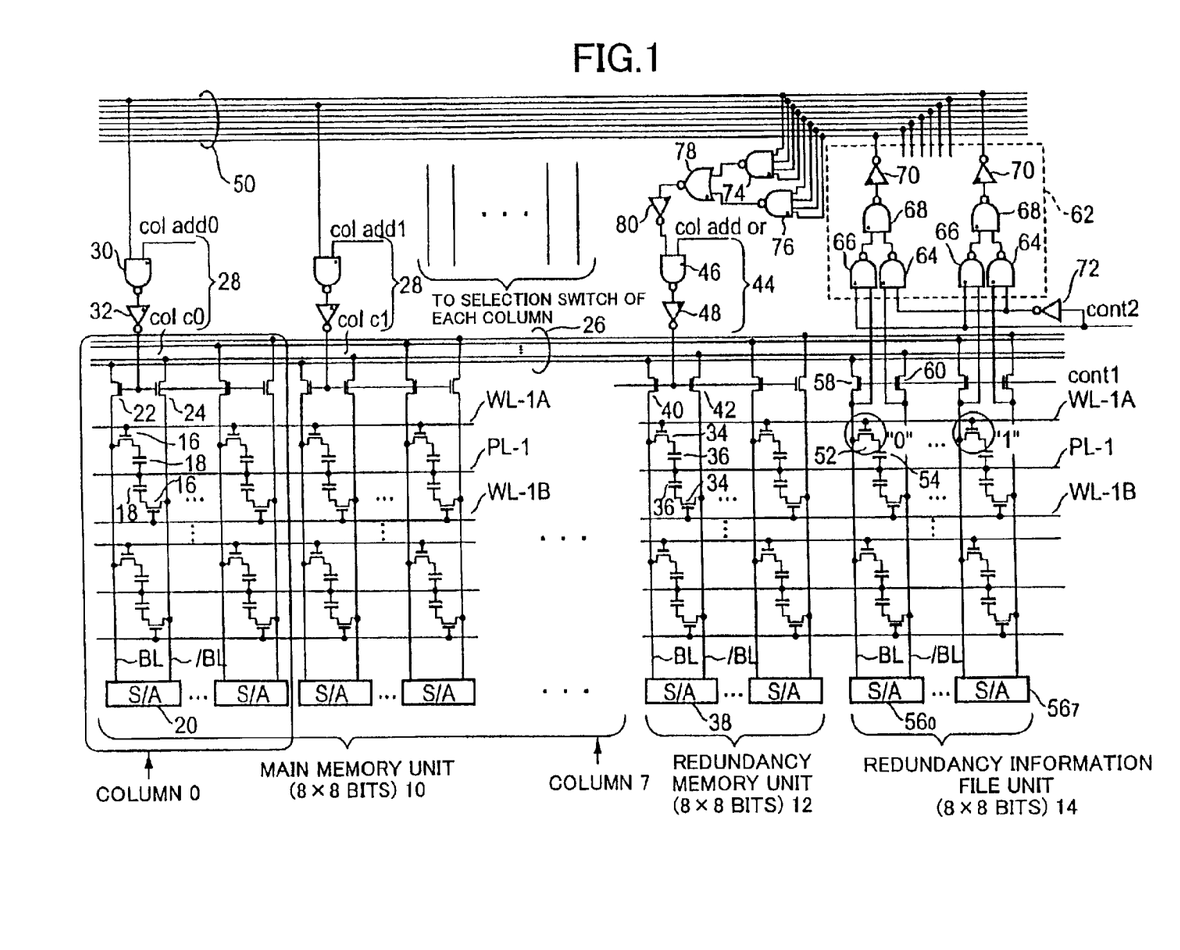
FIG. 1 is a circuit diagram of a semiconductor integrated circuit of a first embodiment of the present invention.

FIG. 1 is a circuit diagram showing the semiconductor integrated circuit of a first embodiment of the present invention. The semiconductor integrated circuit illustrated in FIG. 1 is a semiconductor memory that includes a main memory unit 10, a redundancy memory unit 12, and a redundancy information file unit 14.

The main memory unit 10 and the redundant memory 12 are selectively activated, according to redundancy information stored in by the redundancy information file unit 14.

The main memory unit 10 includes an array wherein non-volatile memory cells are arranged in a matrix. The array includes m rows and n columns. For explanation purposes, the main memory unit 10 is described as having a unit of eight columns. Only column 0 and column 1 are illustrated in FIG. 1, wherein each column includes eight bits.

One memory cell includes a transistor 16 and a capacitor 18. The gate of the transistor 16 is connected to a corresponding word line such as WL-1A and WL-1B, and the drain of the transistor 16 is connected to one of corresponding bit lines BL and /BL. The source of the transistor 16 is connected to one end of a corresponding capacitor 18. The other end of the capacitor 18 is connected to a corresponding plate line, such as PL-1. The bit lines BL and /BL are connected to a corresponding sense amplifier (S/A) 20. Further, the bit lines BL and./BL are connected to a corresponding data bus line of a data bus 26 through transistors 22 and 24, respectively, that function as column selection switches.

Here, the word lines WL-1A, WL-1B, etc. are driven by word line drivers that are omitted from FIG. 1. A word line driver drives selectively according to a local address obtained by decoding an address signal supplied from an external source.

A column decoder 28 is provided to each column. The column decoder 28 includes a NAND gate 30 and an inverter 32. One end of the NAND gate 30 of each column decoder 28 is connected to a corresponding bus line of a control bus 50. The control bus 50 is controlled by an output of a logical circuit 62, as described later. The other end of each NAND gate 30 receives a corresponding column address signal such as col add0, col add1, and so on. These column address signals are obtained by decoding the address signal supplied from an external source. When a column, for example the column 0, is chosen, a column decoder 28 corresponding to eight bits of the column 0 provides a high-level output to the gate of transistors 22 and 24.

The redundancy memory unit 12 includes a memory cell array, dimensions of which are the same as a column of the main memory unit 10. Since each column of the main memory unit 10 consists of eight bits, in this example, the redundancy memory unit 12 is also configured by eight bits. That is, the redundancy memory unit 12 has a capacity of one column.

Each memory cell of the redundancy memory unit 12 includes a transistor 34 and a capacitor 36. The gate of the transistor 34 is connected to a corresponding word line, such as WL-1A, WL-1B, and so on, and the drain is connected to one of corresponding bit lines BL and /BL, and the source of the transistor 34 is connected to an end of a corresponding capacitor 36. The other end of the capacitor 36 is connected to a corresponding plate line PL-1, etc. The bit lines BL and /BL are connected to a corresponding sense amplifier (S/A) 38. Further, the bit lines BL and /BL are connected to a corresponding data bus line of the data bus 26 through transistors 40 and 42, respectively, which function as column selection switches.

Here, the word lines, such as WL-1A, WL-1B, etc., and the plate lines, such as PL-1, are common to the word lines and the plate lines, respectively, of the main memory unit 10.

A column decoder 44 is provided in the redundancy memory unit 12. The column decoder 44 includes a NAND gate 46 and an inverter 48. One end of the NAND gate 46 is connected to an output of a logical circuit configured by NAND gates 74 and 76 and a NOR gate 78 through an inverter 80. The other end of the NAND gate 46 is connected to column address signal "col add or" that selects the redundancy memory unit 12. The column address signal is obtained by decoding an address signal supplied from an external source. When the redundancy memory unit 12 is selected, the column decoder 44 outputs a high-level signal to the gate of each of the transistors 40 and 42.

The redundancy information file unit 14 has a memory cell array having a bit configuration corresponding to the column of the main memory unit 10. In this example, since the main memory unit 10 is configured by eight bits, the redundancy information file unit 14 is also configured by eight bits. Each bit corresponds to each of the eight columns of the main memory unit 10. The redundancy information file unit 14 stores redundancy information that defines which column among the eight columns of the main memory unit 10 should be replaced with the redundancy memory unit 12 on a line-by-line (such as WL-1A, W-1B and so on) basis of the main memory unit 10.

Each memory cell of the redundancy information file unit 14 includes a transistor 52 and a capacitor 54. The gate of the transistor 52 is connected to a corresponding word line, such as WL-1A, WL-1B, and so on, and the drain is connected to one of corresponding bit lines BL and /BL, and the source of a transistor 52 is connected to an end of a corresponding capacitor 54. The other end of the capacitor 54 is connected to a corresponding plate line, such as PL-1 and so on. The bit lines BL and /BL are connected to correspondence sense amplifiers (S/A) $560$ through $567$. Moreover, the bit lines BL and /BL are connected to a logical circuit 62 through transistors 58 and 60 that function as column selection switches, respectively. The control signal cont1 is provided to the gate of the transistors 58 and 60 that function as the column selection switches.

Here, the word lines WL-1A, WL-1B, etc. and the plate lines PL-1 etc. of the redundancy information file unit are common to the word lines and the plate lines, respectively, of the main memory unit 10 and the redundancy memory unit 12.

The logical circuit 62 includes NAND gates 64, 66, and 68 and an inverter 70, and is provided to each bit line (BL and /BL) of the redundancy information file unit 14. One of two input terminals of the NAND gate 66 is connected to the bit line BL, while the other receives a control signal cont2 that becomes active, when a word line is driven. One of two input terminals of the NAND gate 64 is connected to a bit line /BL, and the other receives the control signal cont2 through an inverter 72.

For example, if a cell 52 connected to a sense amplifier $56_0$, and the word line WL-1A stores "0", as shown in FIG. 1, "0" is output to the bit line BL, and "1" is output to the bit line /BL. These outputs are given to the NAND gates 66 and 64, respectively. If the control signal cont2 is high (H), both the NAND gates 64 and 66 output H, and the NAND gate 68 outputs low (L). Therefore, the inverter 70 outputs H. The output of the inverter 70 passes along a corresponding bus line of the control bus 50, and is provided to a column decoder 28 located in the column 7 (not circuit, but only reference mark is shown in FIG. 1) of the main memory unit 10. Since the H signal is provided to the NAND gate 30 of the column decoder 28 of the column 7, the output of the column decoder 28 selects the corresponding column 7.

In the case that the cell 52 that is connected to the sense amplifier $56_7$ and the word line WL-1A stores "1" as illustrated, "1" is output to the bit line BL, and "0" is output to the bit line /BL. These outputs are given to the NAND gates 66 and 64 through the transistors 58 and 60 of ON state, respectively. If the control signal cont2 is high (H), the output of NAND gate 66 is set to H, and the output of the NAND gate 64 will be set to L, and accordingly, the output of the NAND gate 68 is set to H. Therefore, the inverter 70 outputs L. The output of the inverter 70 passes along a corresponding bus line of the control bus 50, and is provided to the column decoder 28 located in the column 0 of the main memory unit 10. Since the L signal is provided to the NAND gate 30 of the column decoder 28, the output of the column decoder 28 does not select the corresponding column 0.

If the cell 52 connected to the sense amplifier $56_7$ and the word line WL-1A is the only cell that stores "1", and all other cells 52 located on other bit lines store "0", the output of the NAND gate 74 is set to H, and the output of the NAND gate 76 is set to L. Accordingly, the output of the NOR gate 78 is set to L, and the output of the inverter 80 is set to H. Therefore, if the column address signal "col add or" that selects the redundancy memory unit 12 turns on, the output of NAND gate 46 included in the decoder 44 is set to L. Then, the output of the inverter 48 is set to H, and accordingly, the transistors 40 and 42 of the redundancy memory unit 12 will turn on (i.e., set to H), and the redundancy memory unit 12 is selected.

In this manner, a column of the main memory unit 10, which should be transposed to the redundancy memory unit 12 is specified, according to the redundancy information stored in the redundancy information file unit 14.

Each bit of the redundancy information file unit 14 corresponds to each column of the main memory 10, and can replace the cell of the main memory 10 with the redundancy memory unit 12 on a plate block unit basis.

For example, if cells 52 connected to the sense amplifier $56_7$ and connected to all plate lines store "1", the output of NAND gate 74 is set to H, and the output of the NAND gate 76 is set to L, and the output of the NOR gate 78 is set to L, and the output of the inverter 80 is set to H. Therefore, if the column address signal "col add or" that selects the redundancy memory unit 12 turns on (i.e., set to H), the output of NAND gate 46 which constitutes a decoder 44 is set to L, the output of the inverter 48 is set to H, the transistors 40 and 42 of the redundancy memory unit 12 will turn on, and accordingly, the redundancy memory unit 12 is selected. Consequently, the data in all the cells of the column 0 are replaced with the redundancy memory unit 12.

If the cell 52 connected to the sense amplifier $56_7$ and connected to the plate line PL-1 is the only cell that stores "1", and all other cells connected to plate lines other than PL-1 store "0", only the cell 52 of a plate block connected to the plate line PL-1 is replaced with the redundancy memory unit 12, and other cells of plate blocks connected to other plate lines are not replaced.

As above, the redundancy information stored in the redundancy information file unit 14 specifies which cells of the main memory unit 10 are to be transposed to the redundancy memory unit 12 on a plate block basis.

The redundancy information stored in the redundancy information file unit 14 is rewritable. That is, the redundancy information file unit 14 is programmable. If the control signal cont1 is turned on, the transistors 58 and 60 of the redundancy information file unit 14 turn on (set to H), and data to be written are provided from the data bus 26 to the bit lines BL and /BL, and the data are written to a memory cell that is selected by driving a word line and a plate line.

In this manner, data to be written in the main memory unit 10 are stored in the redundancy memory unit 12 on a column-by-column basis by rewriting the redundancy information stored in the redundancy information file unit 14. That is, any columns of the main memory unit 10 can be replaced with the redundancy memory unit 12. In other words, location of data can be freely specified on a column-by-column basis, according to the redundancy information. Thus, the redundancy information serves as a scramble pattern.

As above, even if data are read from all of the columns 0 through 7 of the main memory unit 10, original data are not obtained. It is because contents of one of the eight columns are stored in the redundancy memory unit 12. In this manner, the data are encrypted by using the redundancy memory unit 12.

Moreover, even if data are read from the redundancy memory unit 12, original data are not easily retrieved, unless the redundancy information in the redundancy information file unit 14 is available. Without the redundancy information in the redundancy information file unit 14, it is not easy to determine to which column of the main memory unit 10 the data in the redundancy memory unit 12 should belong.

Further, if the redundancy information provided to the redundancy information file unit 14 is controlled on a word line by word line basis (i.e., row-by-row), in other words if "1" is assigned not uniformly but by design on the row-by-row basis, a stronger encryption is obtained.

Unless the control signal cont1 is controllable from the outside, the redundancy information file unit 14 cannot be activated, therefore, contents of the redundancy information file unit 14 cannot be read from the outside. In the case that an identification number peculiar to the semiconductor integrated circuit should be written using the main memory unit 10 and the redundancy memory unit 12 at the time of manufacture, the control signal cont1 is fixed to L inside the integrated circuit, after writing redundancy information in the redundancy information file unit 14. Thereby, the transistors 58 and 60 are set to OFF state such that the redundancy information in the redundancy information file unit 14 cannot be read from the outside.

Thus, even if data are not software encrypted by applications, the data are hardware encrypted by the semiconductor integrated circuit of the present invention. That is, the data are encrypted by mapping the redundancy information file unit 14. Software encrypted data can also be further encrypted by the semiconductor integrated circuit of the present invention. Furthermore, since arbitrary patterns can be written in the redundancy information file unit 14, a strong encryption power is obtained by changing the pattern stored in the redundancy information file unit 14 as required.

Figure 2A:
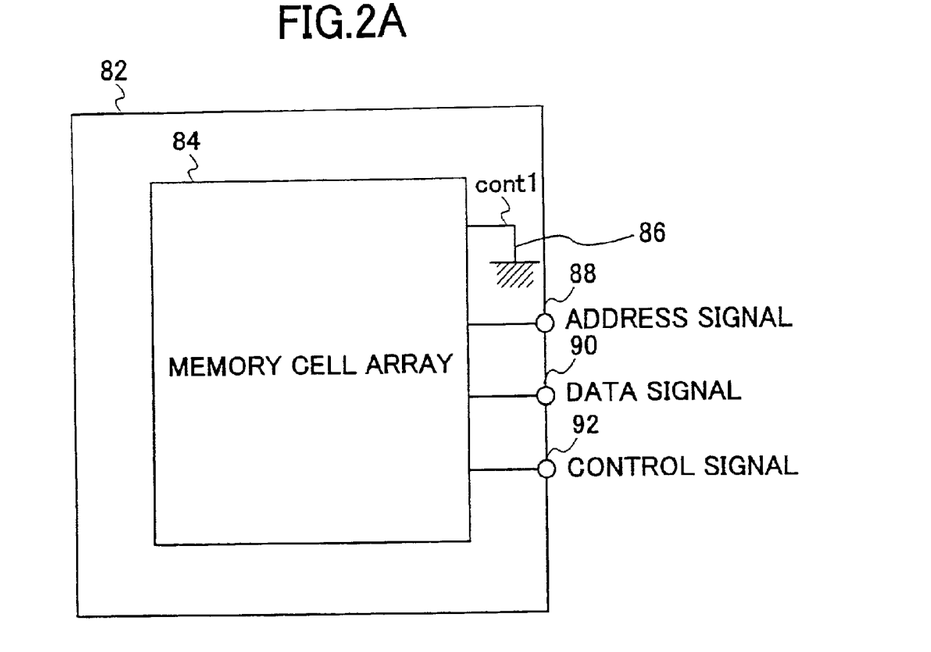
FIG. 2(A) is a figure showing a configuration example of the semiconductor integrated circuit of the first embodiment of the present invention.
Figure 2B:
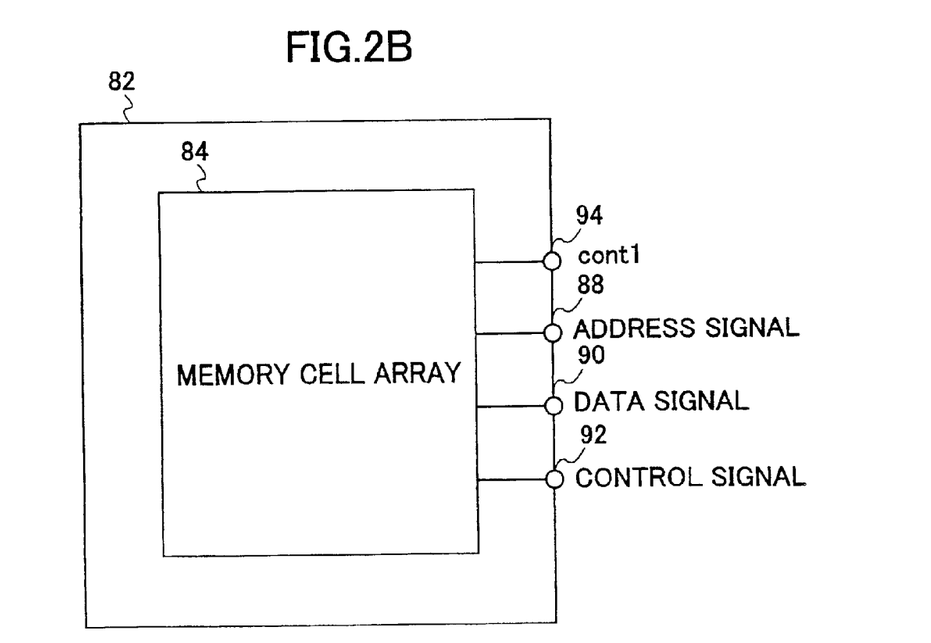
FIG. 2(B) is a figure showing another configuration example of the semiconductor integrated circuit of the first embodiment of the present invention.

FIG. 2(A) and FIG. 2(B) are the figures showing the overall configuration of the semiconductor integrated circuit of the present invention. In FIGS. 2(A) and 2(B), a chip 82 includes a memory cell array 84, and the memory cell array 84 includes the circuit shown in FIG. 1 and peripheral circuits thereof (for example, an address decoder and a timing circuit that generates a control signal cont2).

FIG. 2(A) shows an example wherein the control signal cont1 is fixed to L (the ground level) inside the chip. A signal line 86 that provides the control signal cont1 is connected to the ground inside the chip 82. Further, the chip 82 includes external connection terminals 88, 90, and 92, through which an address signal, a data signal, and a control signal flow, respectively.

FIG. 2(B) shows an example wherein the control signal cont1 is provided from an external source. The control signal cont1 is supplied to the memory cell array 84 through the external connection terminal 94 prepared in the chip 82. The redundancy information in the redundancy information file unit 14 can be rewritten by supplying the control signal cont1 to the terminal 94, and supplying redundancy information to the terminal 90. The redundancy information can be made hard to distinguish by rewriting the redundancy information frequently using the control signal cont1.

Moreover, when two or more chips are provided on a circuit board, forming a system, secrecy of data can be enhanced by writing different redundancy information to every chip.

Figure 3:
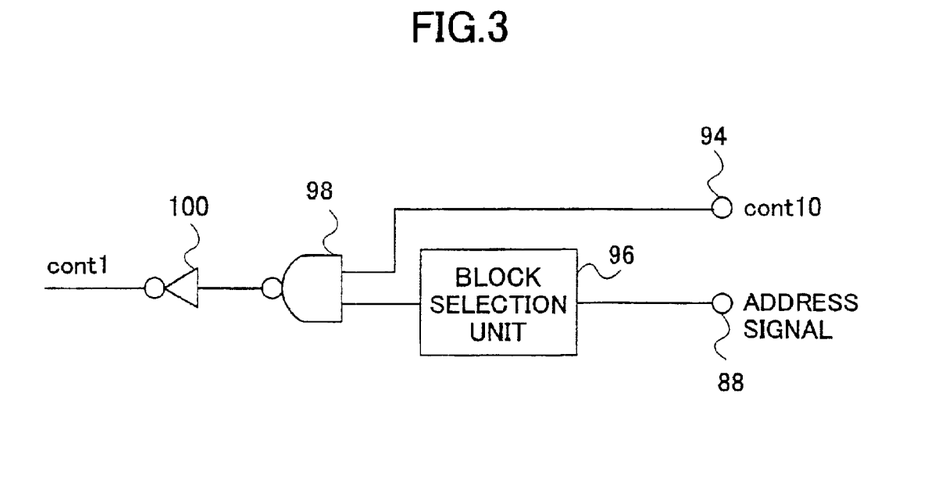
FIG. 3 is a circuit diagram of a circuit that generates a control signal cont1.

The configuration shown in FIG. 2(B) where the control signal cont1 is supplied from an external source can be structured as shown in FIG. 3. That is, the control signal cont10, which enables writing of the redundancy information file unit 14, is given to a terminal 94 from an external source. At this time, the address signal given to the terminal 88 indicates an address of the redundancy information file unit 14. A block selection unit 96 outputs a block selection signal of H (high-level) to a NAND gate 98, if the address signal is pointing to the redundancy information file unit 14. The NAND gate 98 receives the block selection signal of H, and the control signal of H, and outputs L. An inverter 100 reverses this L, and outputs the control signal cont1 of H.

In addition, the configuration of FIG. 1 may be used such that the redundancy memory unit 12 serves to salvage a defective cell of the main memory unit 10. This salvage can be applied to not only an initial failure but also a defect that occurs while in use. Moreover, the redundancy memory unit 12 may be used for both salvage of a defective cell, and encryption processing.

As above, in the first embodiment, the redundancy memory unit 12 serves enhancement of the data secrecy and salvage of defective cells.

The redundancy information written in the redundancy information file unit 14 can be defined per word line, that is, on a row-by-row basis. Further, the redundancy memory unit 12 can be used as a bank by setting up the same redundancy information pattern to all words.

Figure 4:
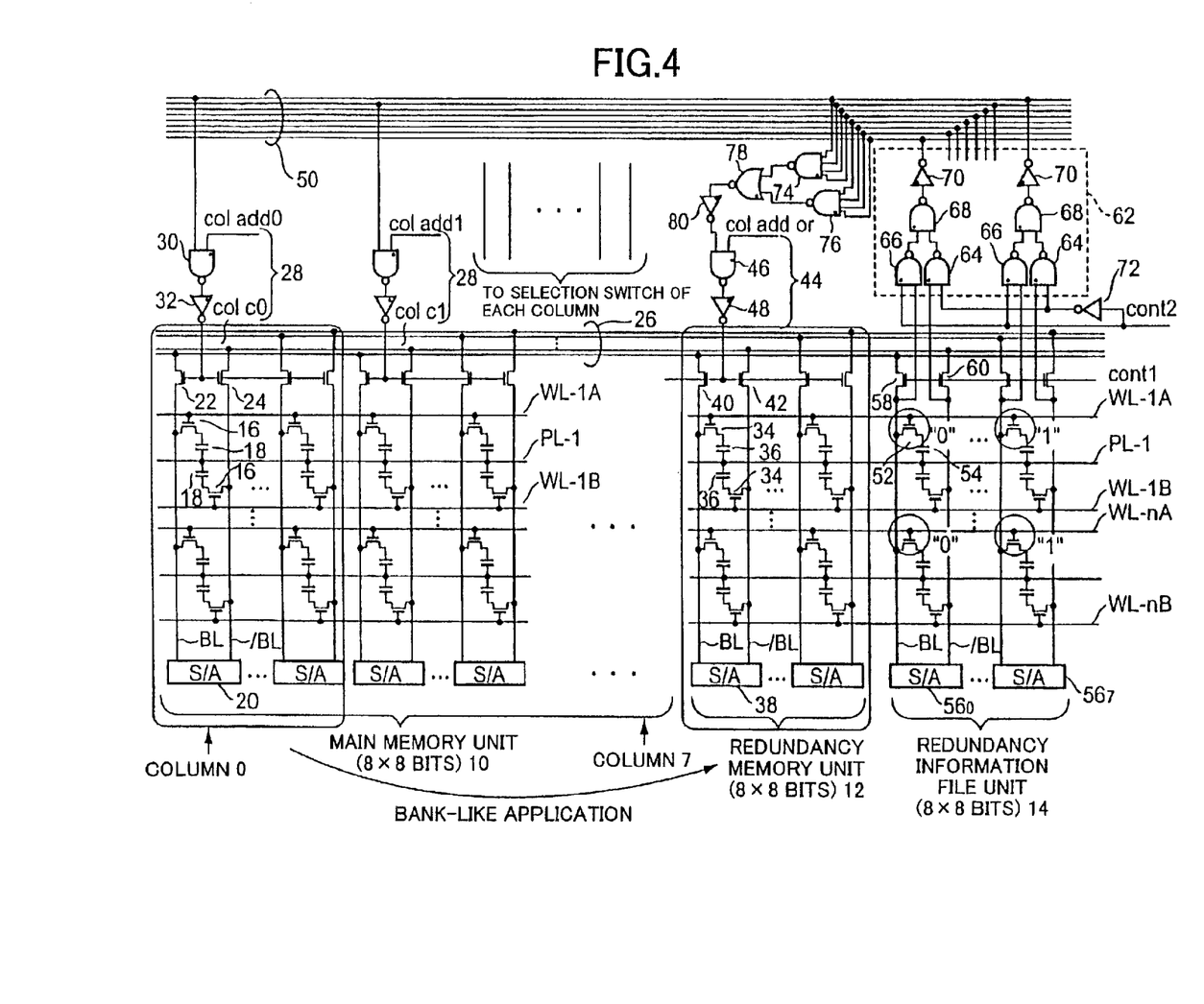
FIG. 4 is a circuit diagram explaining a bank-like use in the configuration of FIG. 1.

FIG. 4 shows the case where the redundancy memory unit 12 is used as the bank. In FIG. 4, each memory cell of the bit line of the redundancy information file unit 14 corresponding to the column 0 of the main memory unit 10 is loaded with "1". That is, the redundancy information pattern of "00000001" is written to all the word lines. Thereby, all the memory cells of the column 0 are transposed to the redundancy memory unit 12. Here, if the redundancy information pattern is changed to "00000000", the column 0 will be activated and the redundancy memory unit 12 will not be selected. Therefore, if the column 0 of the main memory unit 10 stores data that are different from data stored in the redundancy memory unit 12, and the redundancy information pattern is switched between "00000001" and "00000000", the bank operation between memory banks is attained.

According to this configuration, no additional address space is needed, and safety degrading caused by using an external ROM can be avoided. Another usage of the semiconductor integrated circuit of the present invention is to calculate a present status, while rewriting a program according to an application wherein the status changes.

Switching between the redundancy information pattern of "00000001" and "00000000" requires rewriting of all the memory cells of the redundancy information file unit 14.

Figure 5A:
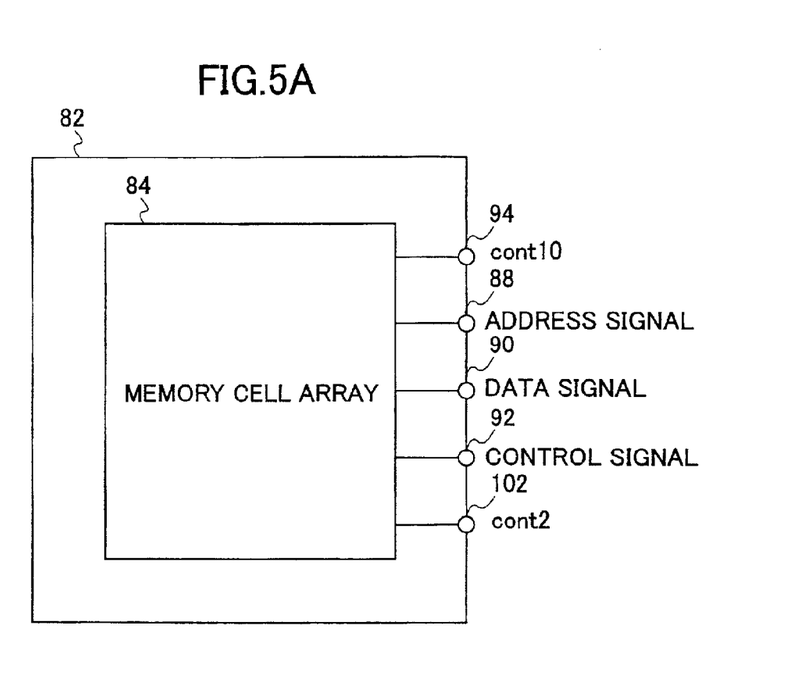
FIG. 5(A) is a figure showing the overall configuration of the semiconductor integrated circuit shown in FIG. 1, when it is used in a memory bank-like manner.
Figure 5B:
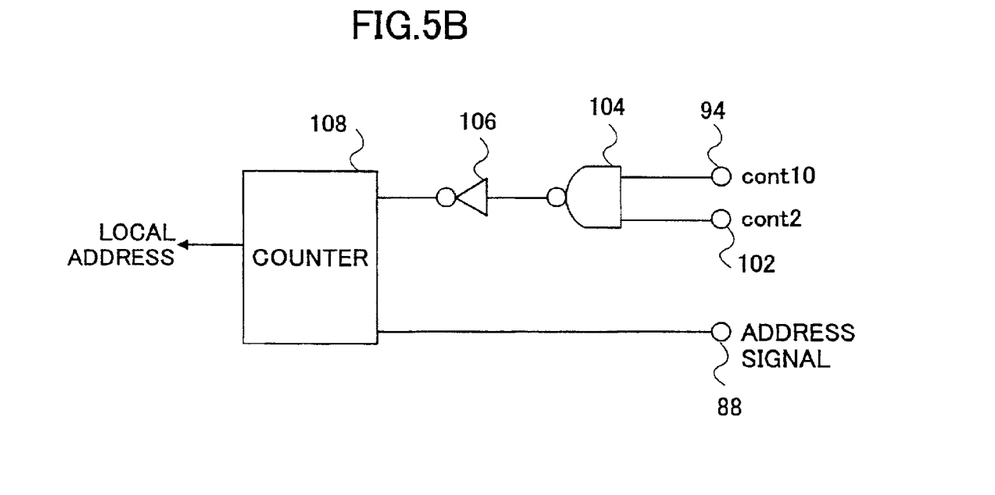
FIG. 5(B) is a circuit diagram showing a configuration example of a local address generating unit of the semiconductor integrated circuit shown in FIG. 1.

As regards the bank switching, a configuration that can rewrite the redundancy information efficiently is shown in FIG. 5(A) and FIG. 5(B). As shown in FIG. 5(A), the chip 82 includes an external connection terminal 102 that receives a control signal cont2 from an external source. The control signal cont2 is a signal that directs a bank mode. When the control signal cont2 is H, data of all the memory cells of the redundancy information file unit 14 are rewritten.

FIG. 5(B) shows a local address generating unit. A NAND gate 104 receives the control signals cont10 and cont2, and provides an output to a counter 108 through an inverter 106 as illustrated. When both the control signals cont10 and cont2 are H, the counter 108 is activated, and makes an address received through the terminal 88 a start address, and increments (or decrements) the address one by one. The start address indicates one of a word line WL-1A and a word line WL-nB (refer to FIG. 4). The counter 108 automatically generate an address (called a local address) that selects a word line sequentially from the start address. At this time, a data signal given to a terminal 90 is the redundancy information, which is to be written, and is supplied on the data bus 26. The address counter 108 selects word lines (rows) of the redundancy information file unit 14 one by one, such that the redundancy information is written in all the memory cells of the redundancy information file unit 14.

Figure 6:
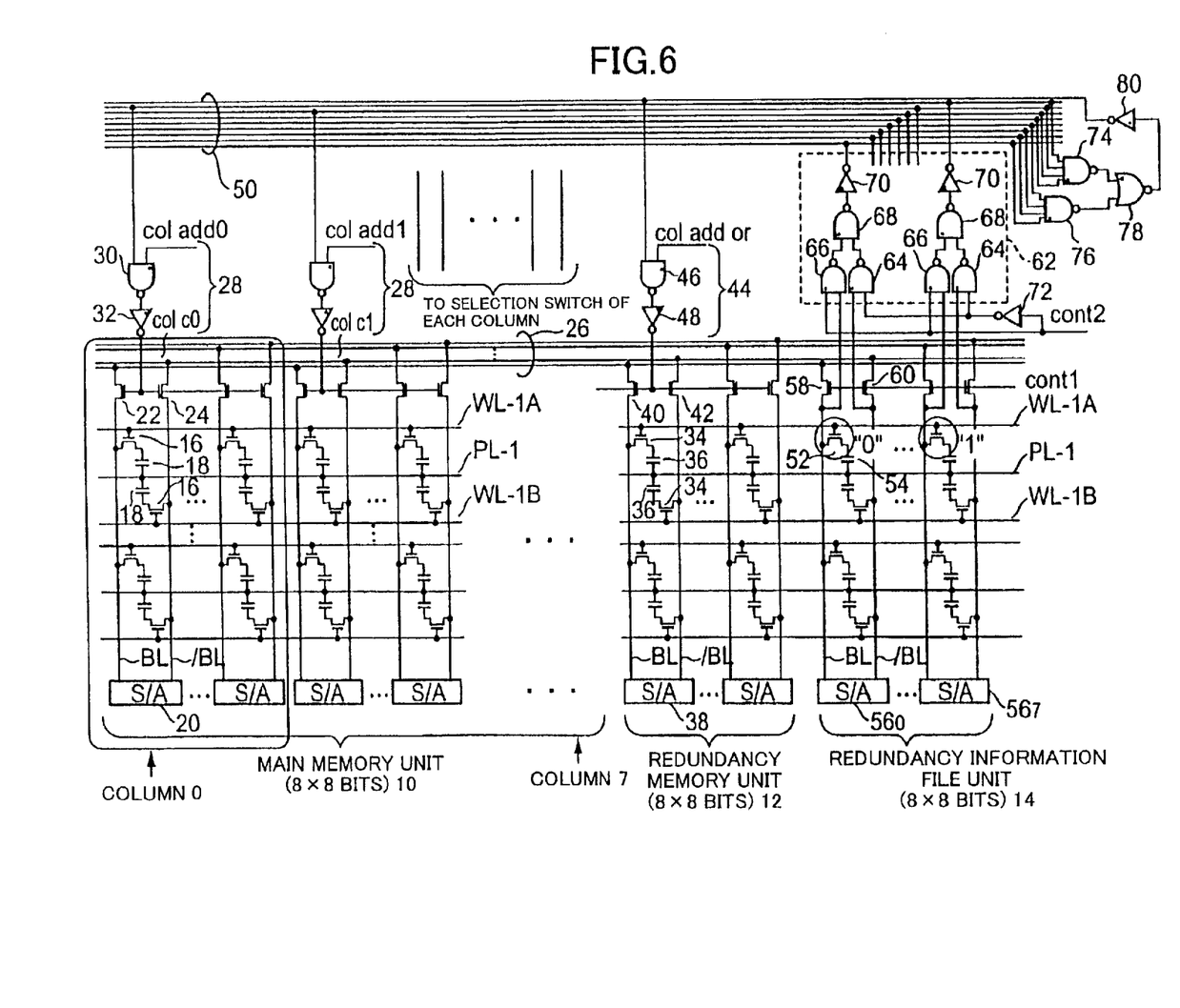
FIG. 6 is a circuit diagram showing a second embodiment of the present invention.

FIG. 6 is a circuit diagram showing the semiconductor integrated circuit of a second embodiment of the present invention. The same reference numbers are given to the same items that have been described above.

In the second embodiment of the present invention, a logic circuit that controls the column decoder 44 of the redundancy memory unit 12 is laid out on the right-hand side of FIG. 6, such that a layout of the column decoder 44 looks the same as the column decoder 28 of the main memory unit 10. This makes it difficult to visually identify the redundancy memory unit 12. The circuit configuration and operations of the second embodiment are the same as the first embodiment.

Since both the column decoders 28 and 44 include a 2-in 1-out NAND gate and an inverter, the layout is the same. Moreover, the same is said of the surrounding layout of the column decoders 28 and 44. Furthermore, the layout of the main memory unit 10 and the redundancy memory unit 12 are the same. Therefore, it is very difficult to make distinction between the main memory unit 10 and the redundant memory unit 12 by viewing the layout. Thus, anti-tamper characteristics of the semiconductor integrated circuit of the present invention are enhanced.

Figure 7:
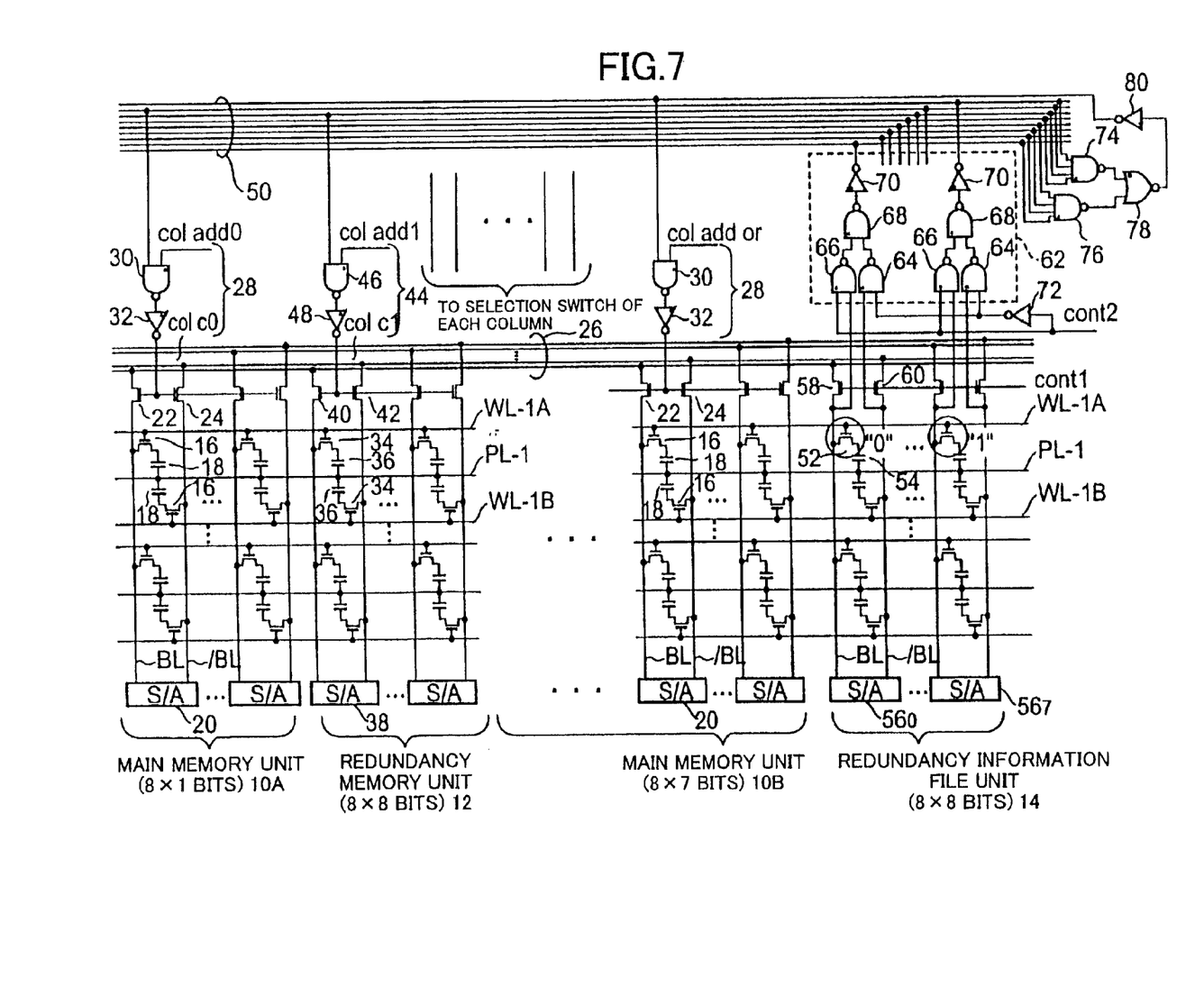
FIG. 7 is a circuit diagram showing a third embodiment of the present invention.

FIG. 7 is a circuit diagram showing the semiconductor integrated circuit of a third embodiment of the present invention. The same reference numbers are given to the same items that have been described above.

The third embodiment is characterized by providing the redundancy memory unit 12 inside the main memory unit 10. The redundancy memory unit 12 is inserted between columns of the main memory unit 10, separating the main memory unit into two parts, namely a main memory unit 10A and a main memory unit 10B. The main memory unit 10A, in this example of FIG. 7, includes a column 0, and the main memory unit 10B includes columns 1 through 7. The position of the redundancy memory unit 12 is not limited to this example, and can be provided in any column position of the main memory unit.

In this manner, the semiconductor integrated circuit of the present invention has strong anti-tamper characteristics, making it highly difficult to visually distinguish the main memory unit 10 from the redundant memory 12.

As described above, the semiconductor integrated circuit of the present invention provides uniform and flexible encryption, independent of confidentiality of data to be stored.

Further, the present invention is not limited to these embodiments, but various variations and modifications may be made without departing from the scope of the present invention.

The present application is based on Japanese priority application No. 2001-320910 filed on Oct. 18, 2001 with the Japanese Patent Office, the entire contents of which are hereby incorporated by reference.

What is claimed is:

1. A semiconductor integrated circuit, comprising:

a main memory unit, a redundancy memory unit, and a redundancy information file unit, wherein security of data stored in the semiconductor integrated circuit is enhanced by changing physical location of at least a part of the data that are otherwise to be stored in the main memory unit to the redundancy memory unit, according to redundancy information stored in the redundancy information file unit.

2. The semiconductor integrated circuit as claimed in claim 1, wherein the redundancy information is capable of being rewritten.

3. The semiconductor integrated circuit as claimed in claim 1, wherein the redundancy information is fixed, and is not capable of being rewritten from an external source.

4. The semiconductor integrated circuit as claimed in claim 1, wherein the redundancy information file unit comprises a non-volatile memory, and is capable of being rewritten from an external source.

5. The semiconductor integrated circuit as claimed in claim 1, wherein the redundancy information file unit comprises:

a non-volatile memory, and a control terminal through which an external source can select the non-volatile memory.

6. The semiconductor integrated circuit as claimed in claim 1, wherein the main memory unit comprises a plurality of columns, and the changing physical location of writing is performed on a column-by-column basis of the main memory unit.

7. The semiconductor integrated circuit as claimed in claim 1, further comprising:

a decoder that selects a column of the main memory unit, and a decoder that selects a column of the redundancy memory unit, wherein a circuit pattern of the decoder that selects the column of the main memory unit and a circuit pattern of the decoder that selects the column of the redundancy memory unit are the same.

8. The semiconductor integrated circuit as claimed in claim 1, wherein the redundancy memory unit is provided inside the main memory unit.

9. A semiconductor integrated circuit, comprising:

a main memory unit, a redundancy memory unit, and a redundancy information file unit, wherein the redundancy memory unit is used for writing at least a part of data to be written according to redundancy information stored in the redundancy information file unit, in addition to salvaging a defective cell in the main memory.

10. A semiconductor integrated circuit, comprising:

a main memory unit, a redundancy memory unit, a redundancy information file unit, and a writing control unit that controls such that at least a part of data otherwise to be stored in the main memory unit is stored in the redundancy memory unit according to redundancy information stored in the redundancy information file unit, even though there are no defects in an area to be written of the main memory unit.

11. A semiconductor integrated circuit, comprising:

a main memory unit, a redundancy memory unit, a redundancy information file unit, and a writing control unit that controls such that data otherwise to be stored in a defective cell of the main memory unit are stored in the redundancy memory unit, and at least a part of data to be stored is in the redundancy memory unit, even though there are no defects in an area of the main memory unit, to which the data are to be stored.

* * * * *